United States Patent [19]
Sadana et al.

[11] Patent Number: 6,090,689
[45] Date of Patent: Jul. 18, 2000

[54] METHOD OF FORMING BURIED OXIDE LAYERS IN SILICON

[75] Inventors: Devendra Kumar Sadana, Pleasantville, N.Y.; Orin Wayne Holland, Lenoir City, Tenn.

[73] Assignee: International Business Machines Corporation, Armonk, N.Y.

[21] Appl. No.: 09/034,445

[22] Filed: Mar. 4, 1998

Related U.S. Application Data

[60] Provisional application No. 60/039,989, Mar. 5, 1997.

[51] Int. Cl.$^7$ ...................................................... H01L 21/76
[52] U.S. Cl. .............................................. 438/480; 117/84
[58] Field of Search ................................... 438/479, 480, 438/766; 117/84, 94, 106

[56] References Cited

U.S. PATENT DOCUMENTS

| | | |
|---|---|---|
| 4,975,126 | 12/1990 | Marail et al. . |
| 5,661,044 | 8/1997 | Holland et al. . |
| 5,707,899 | 1/1998 | Cerofolini et al. . |
| 5,888,297 | 3/1999 | Ogura . |
| 5,891,265 | 3/1992 | Nakai et al. . |

FOREIGN PATENT DOCUMENTS

| | | |
|---|---|---|
| 4-242958 | 8/1992 | Japan . |
| 8-046161 | 2/1996 | Japan . |
| 8-191114 | 7/1996 | Japan . |

OTHER PUBLICATIONS

Dale Hill, Phil Fraundorf and Gail Fraundorf, "The Reduction of Dislocations in Oxygen Implanted Silicon–on–Insulator Layers by Sequential Implantation and Annealing", J. Appl. Phys. 63 (10), p. 4933, May 15, 1998.

W.P. Maszara et al. "Low Dose SIMOX and Impact if ITOX Process on Quality of SOI Film", SOI Conference 1977 Proceedings, IEEE, p 18, Oct. 1997.

M. L. Alles et al. "Analysis of ADVANTOX Thin Box SIMOX–SOI Material", SOI Conference 1977 Proceedings, IEEE, p 10, Oct. 1997.

J. P. Zhang, "A Recent Study of the Formation of SIMOX/SOI Materials and Their Device Applications", SOI Conference 1977 Proceedings, IEEE, p 37, Oct. 1997.

*Primary Examiner*—Chandra Chaudhari
*Assistant Examiner*—Martin Sulsky
*Attorney, Agent, or Firm*—Robert M. Trepp

[57] ABSTRACT

A process for forming Silicon-On-Insulator is described incorporating the steps of ion implantation of oxygen into a silicon substrate at elevated temperature, ion implanting oxygen at a temperature below 200° C. at a lower dose to form an amorphous silicon layer, and annealing steps to form a mixture of defective single crystal silicon and polycrystalline silicon or polycrystalline silicon alone and then silicon oxide from the amorphous silicon layer to form a continuous silicon oxide layer below the surface of the silicon substrate to provide an isolated superficial layer of silicon. The invention overcomes the problem of buried isolated islands of silicon oxide forming a discontinuous buried oxide layer.

15 Claims, 7 Drawing Sheets

TFSOI by 150 keV O⁺-IMPLANTATION OF Si (a) STANDARD:
($3 \times 10^{17}$ cm$^{-2}$ at 525° C)

(b) TWO-STEP:
(Standard + $10^{15}$ cm$^{-2}$ at RT)

METHOD OF FORMING BURIED OXIDE LAYERS IN SILICON

CROSS-REFERENCE TO RELATED APPLICATION

The present application claims priority to co-pending U.S. provisional application Ser. No. 60/039,989 filed Mar. 5, 1997.

The government has rights in this invention pursuant to contract DE-AC05-84OR21400 between the Dept. of Energy and Lockheed Martin Energy Research Corporation.

FIELD OF THE INVENTION

This invention relates to silicon-on-insulator (SOI) substrates for use in the semiconductor industry for fabricating integrated circuits and more particularly to separation by implantation of oxygen (SIMOX) processes to form SOI substrates.

BACKGROUND OF THE INVENTION

SIMOX or separation by implantation of oxygen is a method of fabricating a silicon-on-insulator (SOI) material which can be used in the manufacturing of integrated circuits. SIMOX involves using high-energy ions to implant a large dose of oxygen ions beneath the surface of a bulk Si wafer. Upon high-temperature annealing, the implanted oxygen forms a continuous buried oxide which electrically isolates the Si at the surface (i.e. the superficial layer). Typically, this method has been used to fabricate SOI with a superficial Si and oxide layer thickness of several thousand angstroms.

The implantation of oxygen requires very large doses of O+ ions such as 1.5 to $2.0 \times 10^{18}$ cm$^{-2}$ which takes an hour per wafer in the state of the art ion SIMOX implanter which is expensive. There is an economic incentive to push to thinner buried oxide (BOX) layers to reduce the time required to implant oxygen. Thinner layers are also consistent with the recent development within the microelectronics industry in which low power, portable electronics has become increasingly in demand. Efforts are now underway in industry to produce a SOI material with a buried oxide layer thickness less than or equal to 1000 Angstroms. However, there are difficulties in fabricating such thin buried oxides by the SIMOX method. The reason for this is that since the implanted oxygen is far in excess of its solubility in Si, oxygen comes out of solution as oxide precipitates. At higher doses of oxygen, the precipitates coalesce to form a continuous oxide layer. However, at the smaller doses used to form the thin film SOI, these precipitates remain isolated. The precipitates can be seen in cross-sectional, transmission electron micrographs (XTEM) after high temperature annealing at greater than or equal to 1300° C. where the implanted oxygen at a dose of $3 \times 10^{17}$ cm$^{-2}$ is seen to form isolated islands or pipes of oxide beneath the surface as shown in FIG. 10. Isolated islands or pipes of oxide are unacceptable since they do not provide any isolation for the superficial layer of Si.

In the oxygen dose regime from 3.0 to $4.5 \times 10^{17}$ cm$^{-2}$, a mixture of Si islands submerged in a BOX layer are created. At a dose of about $4 \times 10^{17}$ cm$^{-2}$, the Si island density is minimum in a continuous BOX layer as described by Nakashima et al., SOI Proceeding, pp. 358–367, (1992), Electrochemical society, Pennington, N.J. However for a dose below $4 \times 10^{17}$ cm$^{-2}$ at energies greater than or equal to 170 keV, the BOX layer is found to be discontinuous.

In order to improve the SIMOX process, several different post-implantation annealing conditions have been proposed by D. K. Sadana et al. in publications in Mat. Res. Soc. Symp. Proc. 316, 699 (1994) and Proc. 1993 IEEE International SOI Conference, IEEE, Piscataway, N.J. 1993, p.16. A promising improvement involves annealing the implanted wafers in an oxidizing environment which is described by S. Nakashima et al., Proc. 1994 IEEE International SOI Conference, IEEE, Piscataway, N.J. p.71. In addition to oxide growth at the surface, oxidation also occurs at internal interface(s) of the buried oxide. Even though the rate of internal oxidation is much slower, it is enough to improve the continuity of the thin buried oxide (BOX). However, it is noted that with this technique, a substantial portion of the superficial Si is consumed by oxidation. This consummation of Si obviously limits the SIMOX process to SOI prepared using relatively high-energy oxygen ions to produce a sufficiently thick layer of Si at the wafer surface to serve as a sacrificial layer.

Improvements to the SIMOX process have been proposed by manipulation of the implantation conditions to promote coalescence of the implanted oxygen. A variety of implantation processes for forming thin, continuous buried oxides using SIMOX has been published by F. Namavar et al., Mat. Res. Soc. Symp. Proc. 235, 109 (1992) and by Y. Li et al., Mat. Res. Soc. Symp. Proc. 235, 115 (1992). All of these processes involve the use of much lower energy ions, equal to or less than 40 keV, than the current process which uses ions of an energy equal to or greater than 150 keV. As such, these processes using ions of energy less than 40 keV are not commercially viable because ion implanters do not operate efficiently in the 40 keV energy regime, so that any cost benefit of implanting a lower dose is nullified by this lost efficiency (i.e. beam current).

SUMMARY OF THE INVENTION

In accordance with the present invention, a process is described for forming SOI by first ion implanting oxygen with the substrate at a raised temperature and then subsequently cooling the substrate to a temperature below 200° C. such as room temperature and implanting more oxygen to form an amorphous layer which is annealed to form either defective single crystal silicon and polycrystalline silicon or polycrystalline silicon alone which promotes the coalescence of the implanted oxygen to ensure that the implanted oxygen forms a continuous buried layer of oxide substantially in the vicinity, within 5,000 Å where the amorphous layer had been formed. For example, after an implantation carried out in the range from 480° C. to 650° C., the sample is cooled to near room temperature (RT) at which point a very small dose of O+ ions are implanted to introduce a different damage morphology near the ions' end-of-range. At an appropriate dose, a region is amorphized which is coextensive with that in which the buried oxide is to be formed. Because of the presence of implanted oxygen (both dissolved and precipitated) within this region, the buried amorphous layer will not recrystallize during subsequent high temperature annealing by single crystal growth but rather will form a mixture of defective single crystal Si and polycrystalline Si. The defective single crystal Si contains, for example, stacking faults, micro twins, twins and their bundles. The defective single crystal Si and polycrystalline Si layer acts as a template upon which to form the buried oxide. The presence of defective single crystal Si and polycrystalline Si serves to provide both sites for nucleating oxide growth and paths for the rapid diffusion of oxygen. The paths are along Si defects and polycrystalline Si grain boundaries. The rapid diffusion of oxygen upon the coalescence process can be seen by XTEM which shows that, as a result of the application of this technique, the implanted oxygen forms into a continuous buried oxide during high temperature cycling.

The invention provides a method for forming a continuous buried oxide layer in a silicon substrate comprising the steps of heating the silicon substrate to a predetermined temperature, first implanting oxygen ions at an energy above 100 keV through a major surface of the unpatterned or patterned silicon substrate at a dose in the range from 1 to $10 \times 10^{17}$ cm$^{-2}$, cooling the silicon substrate to about room temperature, second implanting oxygen ions at an energy above 100 keV through said major surface of the silicon substrate at a dose in the range from $1 \times 10^{14}$ cm$^{-2}$ to $1 \times 10^{16}$ cm$^{-2}$ to form a buried amorphous silicon layer containing both dissolved and precipitated oxygen within the amorphous layer, annealing Si wafers with the amorphous silicon layer to form defective single crystal silicon and polycrystalline silicon, and a continuous buried oxide layer whereby the defective single crystal silicon and polycrystalline silicon functions to provide sites for nucleating oxide growth and paths for rapid diffusion of oxygen along the grain boundaries. The method can also be used to create defective Si and polycrystalline Si and a discontinuous buried oxide if desired.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
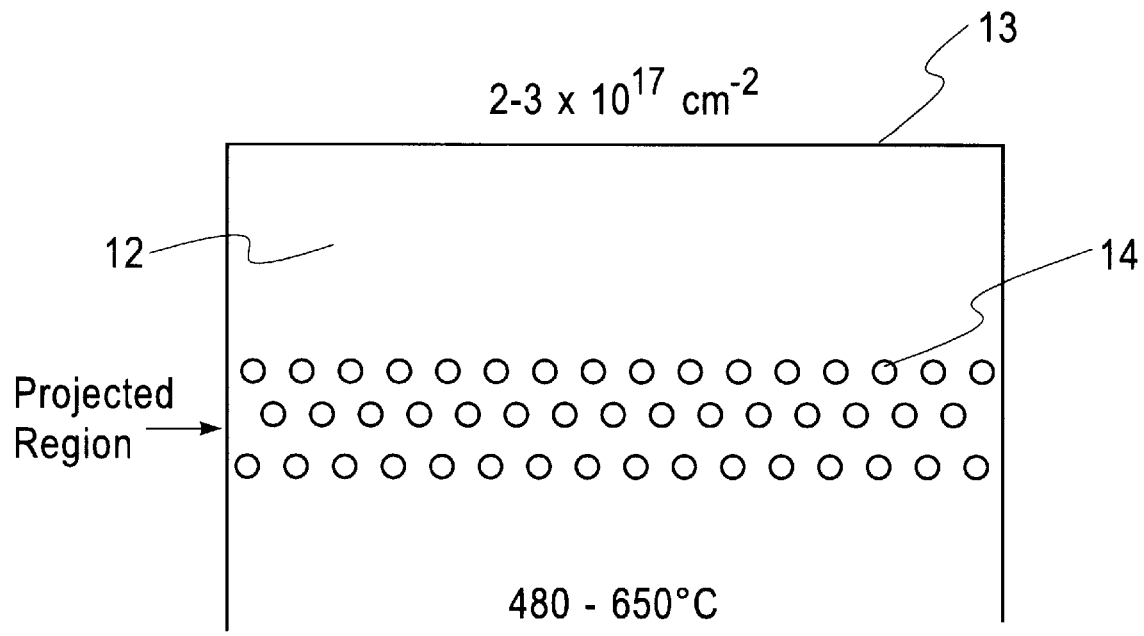
FIG. 1 shows an illustration of a cross section of a Si wafer after a first ion implantation of oxygen at high temperature.

Referring now to the drawing, FIG. 1 shows a Si wafer 12 after a first step of ion implantation of oxygen through upper surface 13. Ion implantation was done using 150 keV O$^+$ ions which were electrostatically scanned to produce uniform coverage over the irradiated portion of wafer 12. The same results can be obtained in state-of-the-art SIMOX implanters where a magnetically scanned ion beam is used. Wafer 12 was a Si (100) n-type which was mounted to a holder which could be heated by an internal resistive heater or by the oxygen ion beam or by a bank of halogen lamps. Wafer 12 may be doped n or p type or undoped depending on its planned future use. An ion implantation dose in the range from $10^{16}$ to $2 \times 10^{18}$ cm$^{-2}$ may be made. A dose of $3 \times 10^{17}$ cm$^{-2}$ was implanted at an ion current density of about 1.2 to about 1.5 microamps/cm$^2$ with the holder held at 600° C. Other combinations of oxygen beam induced heating or radiative heating with halogen lamps can also be used to achieve the desired substrate temperature without significantly altering the final material quality. The implantation temperature may be in the range from 480° C. to 650° C. Under these conditions, the sample temperature quickly reached a stationary temperature of about 525° C. The temperature was determined by an infrared pyrometer mounted in a front-viewing port on the implant chamber. Post implantation annealing was done in an inert ambient nominally mixed with less than 2 per cent oxygen. RBS spectrum were acquired using a standard configuration consisting of an incident beam of 2.3 MeV He+ ions and a solid-state, surface-barrier detector positioned at 160°. Channeling measurements were done along <100>, the axis normal to surface 13.

At sub stoichiometric doses used to form thin oxides (i.e., 3 to $5 \times 10^{17}$ cm$^{-2}$), the implanted oxygen becomes distributed or centered about the end of range (eor) in the form of isolated oxide precipitates 14 in unannealed substrates. The implantation also causes Si damage clusters of Si atoms, Si in interstitial locations and Si vacancies with and/or without oxygen. It is generally agreed that this microstructure contributes to the propensity of the oxide to form discontinuously during post implantation annealing of the prior art.

Figure 2:
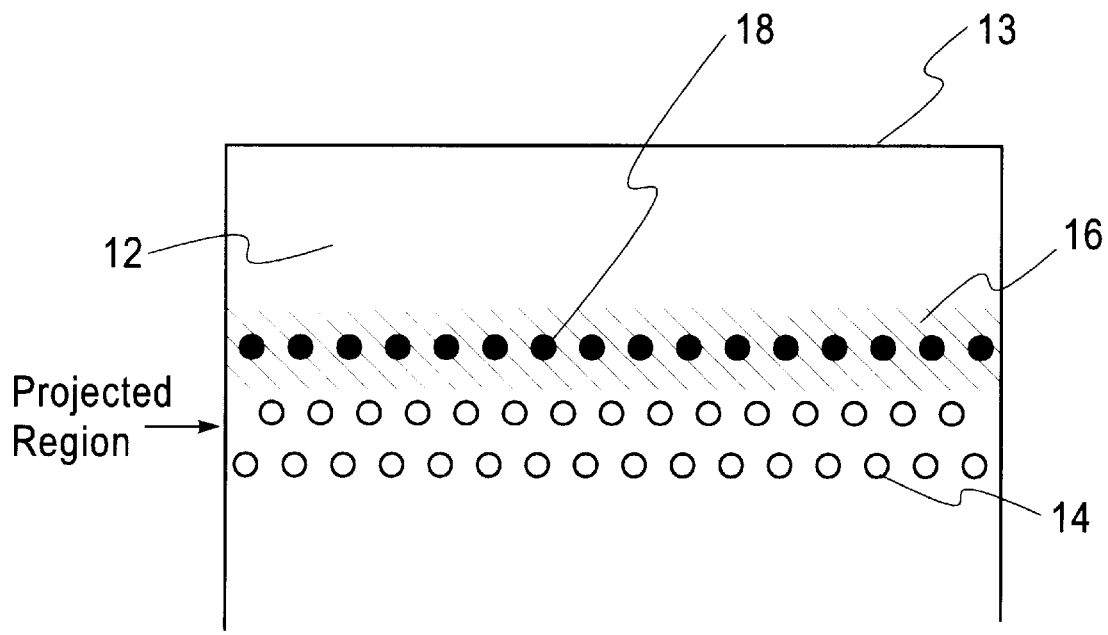
FIG. 2 shows an illustration of a cross section of the Si wafer of FIG. 1 after a second ion implantation of oxygen at nominal room temperature showing a buried continuous amorphous layer of Si.

Wafer 12 is then cooled to near room temperature such as below 100° C. such as at 22° C. or room temperature (RT). Wafer 12 may be cooled further below RT to cryogenic temperatures. Wafer 12 was again irradiated with oxygen ions at a dose in the range from $3 \times 10^{14}$ cm$^{-2}$ to $4 \times 10^{15}$ cm$^{-2}$ to form an amorphous layer 16 shown in FIG. 2 centered about the end of range region. The end of range below the surface may be controlled by adjusting the ion implantation energy. The ion implantation energy may be in the range from 50 kev to 10 Mev. The depth of the end of range below the surface 13 of wafer 12 determines the thickness of the silicon layer above the subsequently formed buried oxide (BOX) layer. It is noted that several different doses of oxygen may be implanted to find the optimum conditions since an insufficient dose will not amorphize the lattice, while an excessive dose will produce too thick of an amorphous layer. Amorphous layer 16 contains both dissolved and precipitated oxygen 18.

Figure 3:
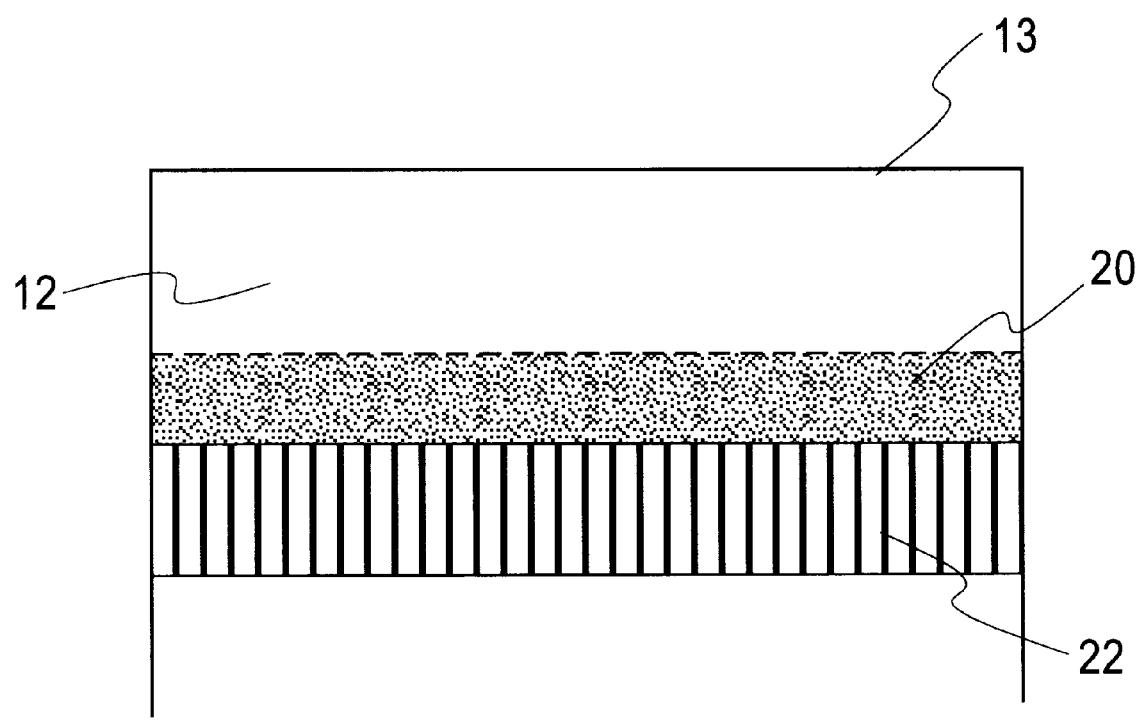
FIG. 3 shows an illustration of a cross section of the Si wafer of FIG. 2 after high temperature anneal showing a buried polycrystalline layer and an adjacent continuous buried silicon oxide layer.

Next, wafer 12 with amorphous layer 16 is annealed above room temperature to form a mixture of defective single crystal silicon and polycrystalline silicon in layer 20 as shown in FIG. 3. Because of the presence of implanted oxygen (both dissolved and precipitated) within amorphous layer 16, amorphous layer 16 will not recrystallize during subsequent above room temperature annealing in the range from 800° C. to 1200° C. by single-crystal growth but rather will form a mixture of defective single crystal silicon and polycrystalline silicon. The preferred first annealing temperature is about 1000° C. The mixture of defective single crystal silicon and polycrystalline silicon in layer 20 acts as a template upon which to form the buried oxide. The mixture of defective single crystal silicon and polycrystalline silicon in layer 20 serves to provide both sites for nucleating oxide growth and paths for rapid diffusion of oxygen along grain boundaries.

Figure 4:
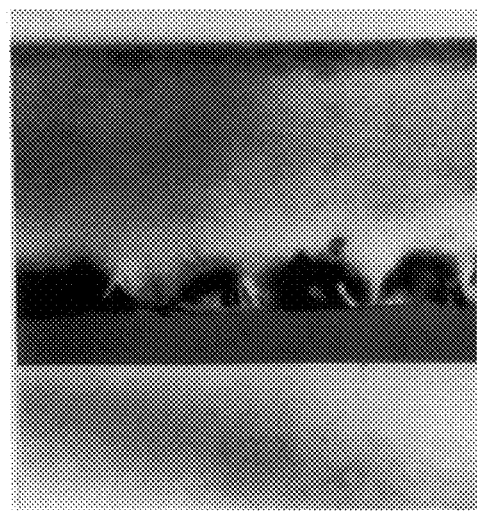
FIG. 4 is a Transmission Electron Microscope (TEM) cross section view of a high temperature anneal SOI wafer showing a buried polycrystalline layer and an adjacent continuous buried silicon oxide layer.

Next, wafer 12 with the mixture of defective single crystal silicon and polycrystalline silicon or a polycrystalline silicon alone forming layer 20 is annealed above 1100° C. and below melting (1420° C. for Si) to form a continuous oxide layer 22 as shown in FIG. 4. Oxide layer 22 has an average thickness of 0.07 µm and contains no visible Si inclusions. To the best knowledge of the inventors, this is the thinnest continuous oxide layer 22 formed by SIMOX using an ion energy greater or equal to 150 keV. The top interface is somewhat undulated with defects including twins and pyramidal stacking faults extending about 0.05 µm into the Si overlayer. It is interesting to note that XTEM inspection indicated that the two-step process as shown in FIG. 4 had a lower density of threading dislocations in the superficial layer than the standard material. Several of the threading defects were observed in SOI made by the single implantation step process of the prior art during routine XTEM inspection of the thinned area, while none could be found in the sample prepared using the two ion implantation steps of the instant invention.

Figure 5:
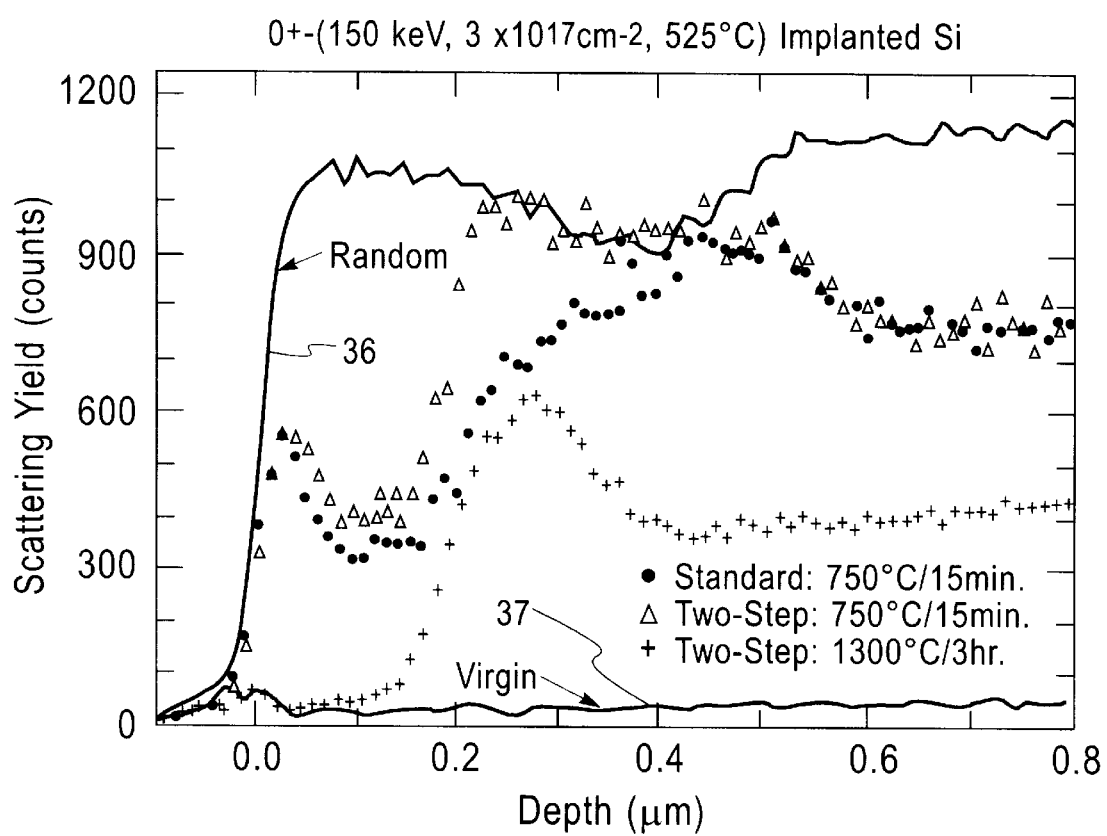
FIG. 5 is a graph of the scattering yield versus backscattered depth in Si samples.

Rutherford Backscattered Spectroscopy (RBS) spectrum is presented in FIG. 5. In FIG. 5, the ordinate represents scattering yield (counts) and the abscissa represents depth (microns) below the wafer surface. A standard random spectrum is shown for reference by curve 36, along with an aligned spectrum from a virgin (nonimplanted) Si crystal shown by curve 37. Two aligned spectra are shown from ion implanted samples after annealing at 750° C. for 15 minutes; one implanted using only one implant dose process of the prior art, and the other by the two-step ion implant process in which a dose of $2 \times 10^{15}$ cm$^{-2}$ was used to amorphize the lattice. The aligned yield from the region between about 0.2 and 0.45 µm within the two-step sample is seen to coincide with the random yield. This is a good indicator that this region had been amorphized by two-step process to selectively form an amorphous and/or polycrystalline layer near $R_p$ (located at 0.31 µm for 150 keV O+ ions). This excess yield indicates the presence of lattice damage in the vicinity of the front oxide/Si interface. XTEM of this sample (not shown) established the presence of damage in the form of an about 0.12 µm polysilicon layer between the buried oxide and the superficial Si.

A dose of $1 \times 10^{15}$ cm$^{-2}$ to $2 \times 10^{15}$ cm$^{-2}$ was found to be closer to optimum for forming a defective single crystal Si and/or polycrystalline Si layer spatially matched to the desired buried oxide. This can be seen in FIGS. 6 and 7, where random and aligned spectra are compared from samples implanted using a single ion implant of the prior art and a two-step ion implant process, respectively, after annealing at greater than or equal to 1300° C.

During the above room temperature anneal step the oxygen concentration is in the range from about 20% to about 100% and more preferable about 100%. During the high temperature anneal step, the oxygen concentration may be in the range from about 0.25% to about 5% and preferably about 2%.

The duration of the above room temperature anneal is in the range from 0 to 60 minutes and preferably about 30 minutes. The duration of the high temperature anneal is in the range from 2 to 40 hours and preferably about 6 hours.

The wafer 12 could include an oxide layer, a dielectric layer, or a polysilicon on the Si surface having a thickness in the range from 0 to 2000 Å and preferable about 500 Å. The silicon oxide layer is preferable. The oxide layer will eliminate contamination coming from for example the ion implanter and the oxide layer can make the final Si wafer surface smoother.

Wafer 12 may include SiGe layers buried below the surface or at the top surface.

Figure 6:
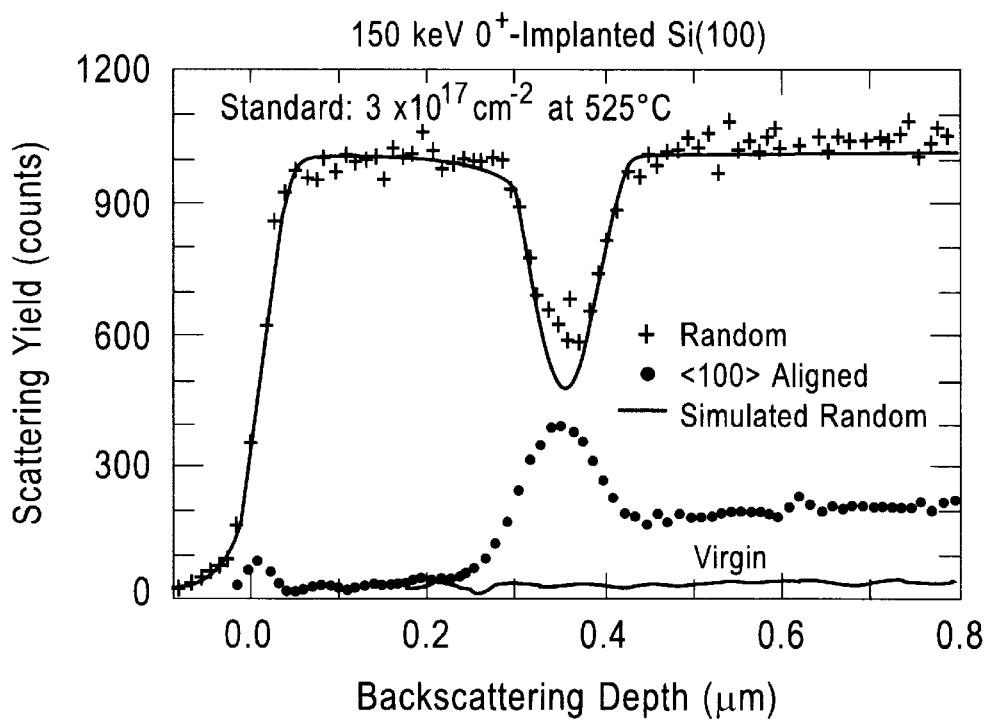
FIG. 6 is a graph of the scattering yield versus backscattered depth of annealed Si samples ion implanted at high temperature according to the prior art.
Figure 7:
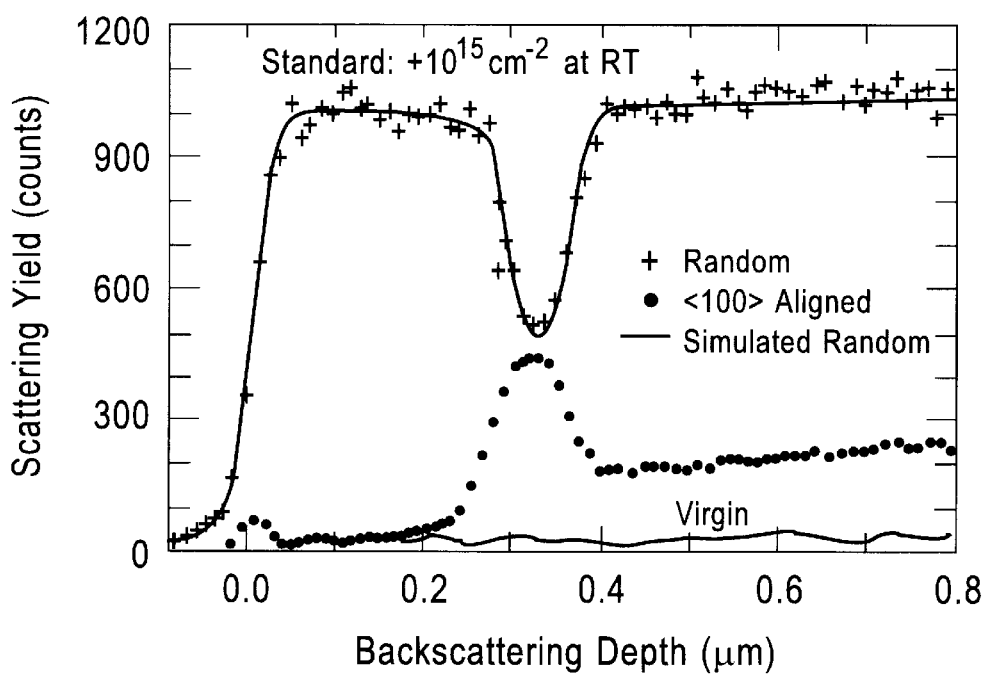
FIG. 7 is a graph of the scattering yield versus backscattered depth of annealed Si samples ion implanted first at high temperature and then at room temperature at a dose of $10^{15}$ cm$^{-2}$ in accordance with the invention.

Several conclusions can be made from examination of these spectra shown in FIGS. 6 and 7. The quality of the superficial layer is very good in both samples. Comparison of the aligned yield from both implanted samples with the virgin yield shows that they are indistinguishable indicating no degradation of the superficial Si as a result of the two-step ion implant process. Clearly, any damage to this region during implantation at room temperature is effectively removed by high-temperature annealing.

Coalescence of the implanted oxygen during annealing has produced an about 0.07 µm buried layer at a depth of about 0.35 µm. This layer is slightly displaced towards the surface in the two-step sample. The reason for this is not clear but may be due to the location of the mixture of defective single crystal silicon and polycrystalline silicon layer in this sample and its ability to transport oxygen. The two-step ion implant process at a dose of $1 \times 10^{15}$ cm$^{-2}$ does not seem to leave any remnant of the polycrystal layer. The rise in the aligned yield shown in FIG. 7 at 0.33 µm is much less than seen in FIG. 5 for a dose of $2 \times 10^{15}$ cm$^{-2}$ and is spatially correlated to the location of the buried oxide. This indicates that most, if not all, of this peak is due to the presence of an oxide at this location. This evidence suggests that the two-step ion implant process can be applied without deleteriously affecting the quality of the superficial layer or the buried oxide interfaces.

Figures 8, 9:
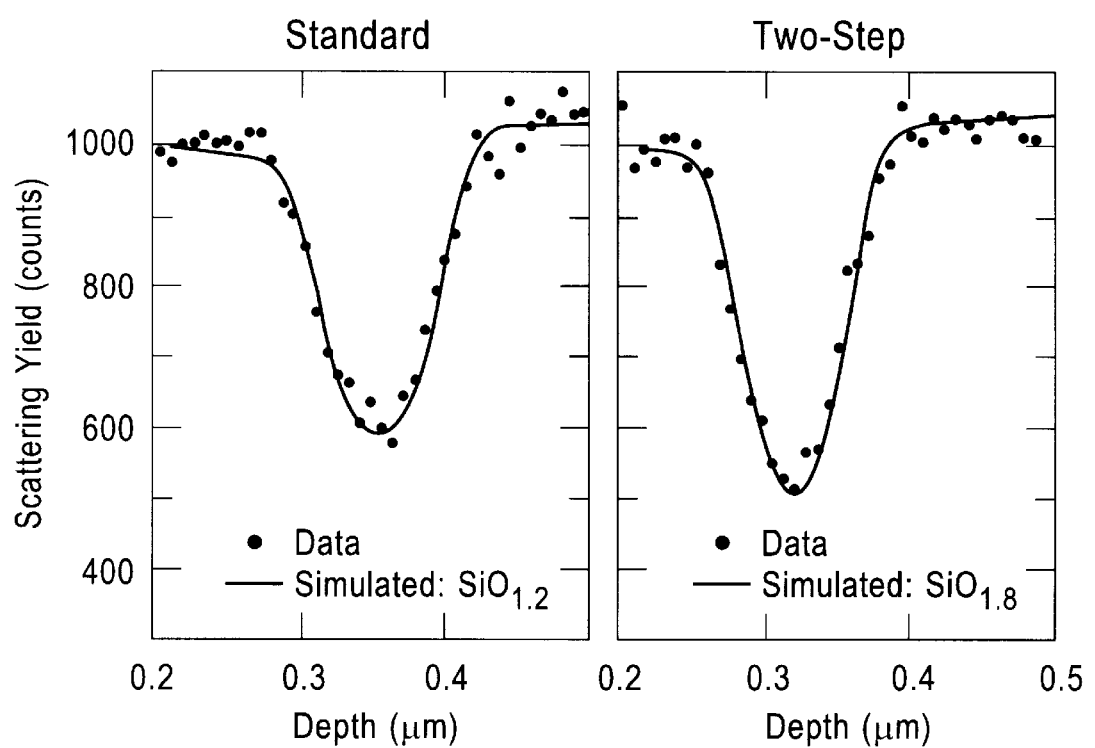
FIG. 8 is a graph in greater detail of the scattering yield versus backscattered depth of annealed Si samples ion implanted at high temperature according to the prior art.
FIG. 9 is a graph in greater detail of the scattering yield versus backscattered depth of annealed Si samples ion implanted first at high temperature and then at room temperature at a dose of $10^{15}$ cm$^{-2}$ in accordance with the invention.

FIGS. 8 and 9 give an expanded view (centered on the buried layer) of the random spectrum in FIGS. 6 and 7, respectively. Also shown, are simulated spectra in which a SOI structure (i.e., Si:SiO$_x$:Si) was used to fit the data. The simulation in FIG. 8 shows the buried oxide (BOX) formed by the prior art single implant process to have an average composition of SiO$_{1.2}$. While the simulation reproduces the major features of the actual spectrum, there appears to be inhomogeneities within BOX which cannot be fit using a single oxide composition i.e., the oxide composition changes over the thickness of the layer. This compares with the two-step ion implant process data shown in FIG. 9 where the degree of fit by the simulation suggests a more homogeneous BOX with a composition of SiO$_{1.8}$. The two-step ion implant process clearly yields a superior thin film SOI than does the prior art single ion implant processing: one in which the BOX is more uniform and has an average composition much nearer to stoichiometric oxide.

Figure 10:
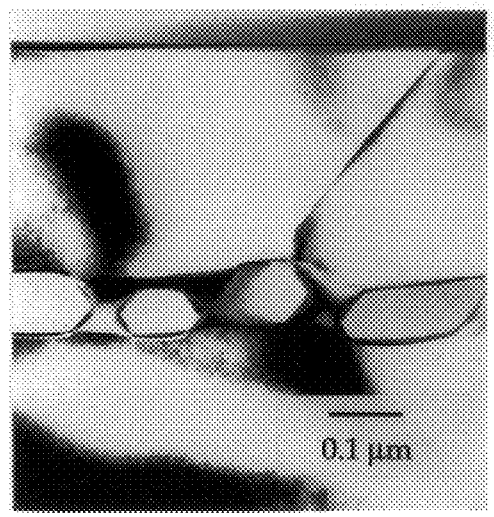
FIG. 10 is a cross section view of a SOI wafer showing a buried discontinuous silicon oxide layer.

The dramatic improvement in the quality of the buried oxide afforded by two-step ion implant processing is seen readily in the XTEMs in FIGS. 4 and 10 which compare the microstructure after greater than or equal to 1300° C. annealing in samples implanted using the a) two-step ion implant processing and b) single ion implant processing of the prior art. The oxide formed by the prior art process is broken while that formed by the two-step ion implant process is completely continuous.

Figure 11:
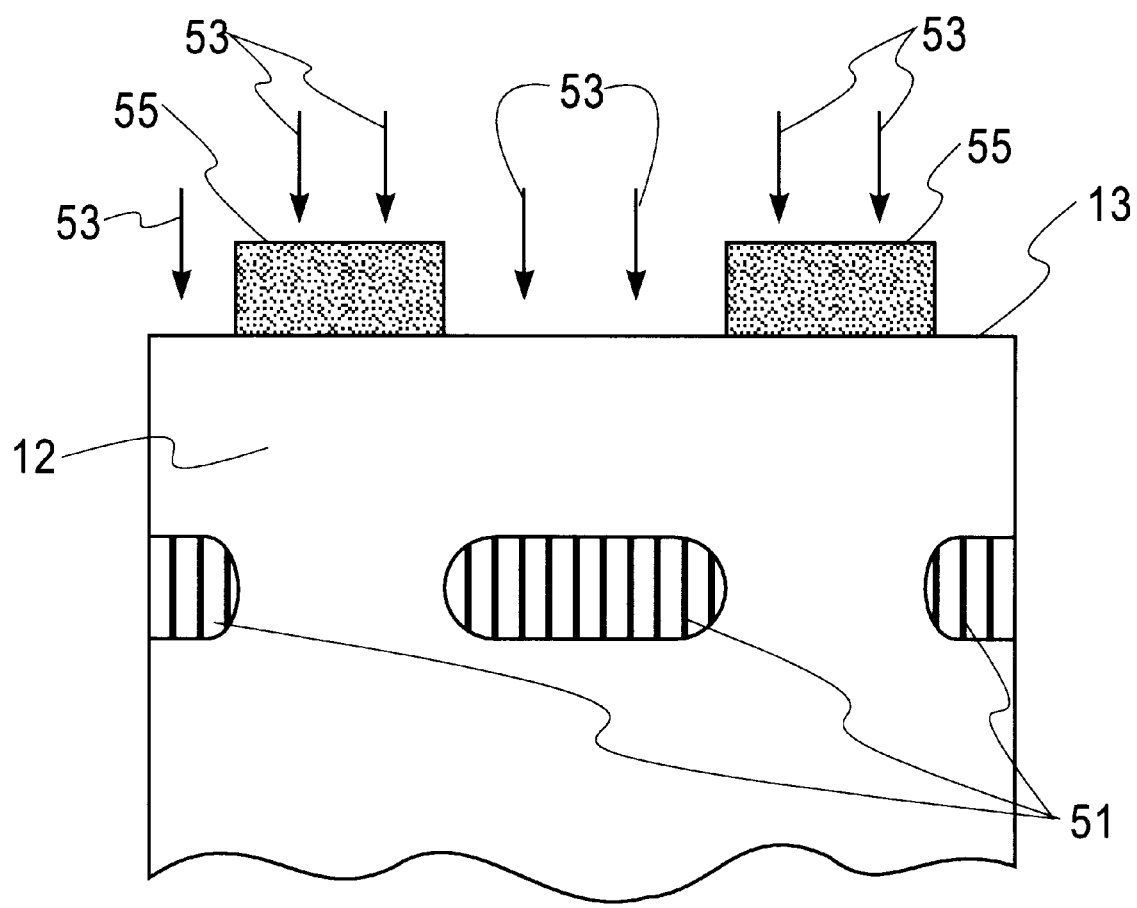
FIG. 11 is a cross section view of a patterned SOI wafer showing buried silicon oxide formed at predetermined locations in silicon using the method of the present invention.

FIG. 11 is a cross-section view of wafer 12 having a patterned buried oxide layer 51 below surface 13. Patterning of the BOX 51 is provided by ion implanting oxygen ions shown by arrows 53 through a mask 55 which is suitable for blocking oxygen atoms such as a dielectric layer of silicon dioxide, silicon nitride of alike which has been lithographically patterned. Mask 55 where present blocks oxygen ions from entering wafer 12. BOX 51 is formed using the present invention which includes a Room Temperature Implant and an anneal.

The invention describes a two-step ion implantation process in which the sample or wafer is first implanted using with an ion implantation dose less than that of the prior art at high temperature after which the sample receives a light ion implantation dose at below 300° such as at 22° C. to create an amorphous layer. The dose parameters which yielded the best results consisted of an implant in the range from $2\times10^{17}$ cm$^{-2}$ to $3\times10^{17}$ cm$^{-2}$ followed by a dose in the range from $1\times10^{15}$ cm$^{-2}$ to $2\times10^{15}$ cm$^{-2}$ at 22° C. (room temperature (RT)). The process produced a continuous buried oxide layer with no Si inclusions at a thickness of about 0.07 µm. The two step ion implantation process also reduced the density of threading defects in the superficial Si.

While there has been described and illustrated a process for forming Silicon-on Insulator (SOI) via ion implantation of oxygen, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method for forming an isolated silicon layer on a silicon containing substrate having a major surface comprising the steps of:

heating said silicon containing substrate to a first temperature, first implanting oxygen ions at a first energy corresponding to a depth for formation of a desired isolated silicon layer thickness through said major surface of said silicon containing substrate at a dose in the range from about $1\times10^{16}$ cm$^{-2}$ to about $2\times10^{18}$ cm$^{-2}$, cooling said silicon containing substrate below 200° C., second implanting oxygen ions at a second energy through said major surface of said silicon containing substrate at a temperature below 200° C. at a dose in the range from about $1\times10^{14}$ cm$^{-2}$ to about $1\times10^{16}$ cm$^{-2}$ to form an amorphous silicon layer containing both dissolved and precipitated oxygen within said amorphous layer, first annealing said amorphous silicon layer above room temperature to form polycrystalline silicon, and second annealing said polycrystalline silicon in the range from 1100° C. to below the melting temperature to form a continuous oxide layer whereby said polycrystalline silicon functions to provide sites for nucleating oxide growth and paths for rapid diffusion of oxygen along its grain boundaries.

2. The method of claim 1 wherein said second energy is within 50 keV of said first energy.

3. The method of claim 1 wherein said first and second energies are about 150 keV.

4. The method of claim 1 wherein said first temperature is in the range from 480° C. to 650° C.

5. The method of claim 1 wherein said second energy is in the range from 50 keV to 10 Mev.

6. The method of claim 1 wherein said step of first annealing is at a temperature and duration to form a mixture of defective single crystal silicon and polycrystalline silicon which provides both sites for nucleating oxide growth and paths for rapid diffusion of oxygen along grain boundaries.

7. The method of claim 1 further including, before the step of heating, the step of placing a mask on said major surface and patterning said mask to provide areas where no buried oxide layer is formed.

8. A method for forming a continuous buried layer of silicon oxide in a silicon containing substrate having a major surface comprising the steps of:

forming a first continuous or discontinuous region below said major surface of said silicon containing substrate of dissolved and precipitated oxygen formed by ion implanting oxygen, forming a second region of amorphous silicon coextensive with said first continuous or discontinuous region including the step of implanting oxygen ions through a major surface of said silicon containing substrate at a temperature below 200° C. at a dose in the range from about $1\times10^{14}$ cm$^{-2}$ to about $1\times10^{16}$ cm$^{-2}$, first annealing said first continuous or discontinuous region and said second region to form polycrystal silicon, and second annealing said polycrystalline silicon to form a continuous buried oxide layer.

9. A method for forming an isolated silicon layer on a silicon containing substrate having a major surface comprising the steps of:

heating said silicon containing substrate to a first temperature, first implanting oxygen ions at a first energy corresponding to a depth for formation of a desired isolated silicon layer thickness through said major surface of said silicon containing substrate at a dose in the range from about $1\times10^{16}$ cm$^{-2}$ to about $2\times10^{18}$ cm$^{-2}$, cooling said silicon containing substrate below 200° C., second implanting oxygen ions at a second energy through said major surface of said silicon containing substrate at a temperature below 200° C. at a dose in the range from about $1\times10^{14}$ cm$^{-2}$ to about $1\times10^{16}$ cm$^{-2}$ to form an amorphous silicon layer containing both dissolved and precipitated oxygen within said amorphous layer, first annealing said amorphous silicon layer above room temperature to form a mixture of defective single crystal silicon and polycrystalline silicon, and second annealing said mixture of defective single crystal silicon and polycrystalline silicon in the range from 1100° C. to below the melting temperature to form a continuous oxide layer whereby said mixture of defective single crystal silicon and polycrystalline silicon functions to provide sites for nucleating oxide growth and paths for rapid diffusion of oxygen along its grain boundaries.

10. A method for forming a continuous buried layer of silicon oxide in a silicon containing substrate having a major surface comprising the steps of:

forming a first continuous or discontinuous region below said major surface of said silicon containing substrate of dissolved and precipitated oxygen formed by ion implanting oxygen, forming a second region of amorphous silicon coextensive with said first continuous or discontinuous region including the step of implanting oxygen ions through a major surface of said silicon containing substrate at a temperature below 200° C. at a dose in the range from about $1 \times 10^{14}$ cm$^{-2}$ to about $1 \times 10^{16}$ cm$^{-2}$, first annealing said first continuous or discontinuous region and said second region to form a mixture of defective single crystal silicon and polycrystal silicon, and second annealing said mixture of defective single crystal silicn and polycrystalline silicon to form a continuous buried oxide layer.

11. The method of claim 9 wherein said second energy is within 50 keV of said first energy.

12. The method of claim 9 wherein said first and second energies are about 150 keV.

13. The method of claim 9 wherein said first temperature is in the range from 480° C. to 650° C.

14. The method of claim 9 wherein said second energy is in the range from 50 keV to 10 Mev.

15. The method of claim 9 further including, before the step of heating, the step of placing a mask on said major surface and patterning said mask to provide areas where no buried oxide layer is formed.

* * * * *